(12) United States Patent
Chen et al.

(10) Patent No.: US 9,714,966 B2
(45) Date of Patent: Jul. 25, 2017

(54) CIRCUIT AGING SENSOR

(71) Applicant: TEXAS INSTRUMENTS INCORPORATED, Dallas, TX (US)

(72) Inventors: Min Chen, Allen, TX (US); Vijay Kumar Reddy, Plano, TX (US); John M. Carulli, Jr., Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 813 days.

(21) Appl. No.: 14/047,557

(22) Filed: Oct. 7, 2013

(65) Prior Publication Data

US 2014/0097856 A1 Apr. 10, 2014

Related U.S. Application Data

(60) Provisional application No. 61/710,435, filed on Oct. 5, 2012.

(51) Int. Cl.
*G01R 27/28* (2006.01)
*G01R 31/28* (2006.01)

(52) U.S. Cl.
CPC ......... *G01R 27/28* (2013.01); *G01R 31/2884* (2013.01)

(58) Field of Classification Search
None
See application file for complete search history.

(56) References Cited

U.S. PATENT DOCUMENTS

| | | | | |
|---|---|---|---|---|
| 6,842,078 B2* | 1/2005 | Manna | ................. | H03K 3/0315 331/1 A |
| 7,531,836 B2* | 5/2009 | Liu | .................... | G01R 31/2642 257/299 |
| 2004/0263192 A1* | 12/2004 | Persun | ............... | G01R 31/3008 324/762.03 |
| 2006/0049886 A1* | 3/2006 | Agostinelli | ............... | H03L 1/00 331/175 |
| 2006/0192623 A1* | 8/2006 | Baig | ......................... | G06F 1/04 331/57 |
| 2011/0090015 A1* | 4/2011 | Sumita | ................. | H03K 3/0315 331/56 |
| 2011/0193586 A1* | 8/2011 | Kuo | .................... | G01R 31/2621 324/762.08 |
| 2012/0161885 A1* | 6/2012 | Saneyoshi | .......... | G01R 31/2856 331/55 |

* cited by examiner

*Primary Examiner* — Melissa Koval
*Assistant Examiner* — Felicia Farrow
(74) *Attorney, Agent, or Firm* — John R. Pessetto; Charles A. Brill; Frank D. Cimino

(57) ABSTRACT

An integrated circuit includes a circuit aging sensor that provides information regarding operational degradation of the integrated circuit due to aging. The aging sensor includes a ring oscillator that includes inverting drivers and tuning circuits. The drivers are sequentially coupled to form a ring. An output of each of the drivers is coupled to an input of one of the tuning circuits, and an input of each of the drivers is coupled to an output of one of the tuning circuits. Each of the tuning circuits includes a first signal path and a second signal path. The first signal path selectably applies a tuning delay to an input signal received from one of the drivers for provision to an input of a successive one of the drivers. The second signal path selectably routes the signal received around the tuning delay to the input of the successive one of the drivers.

20 Claims, 3 Drawing Sheets

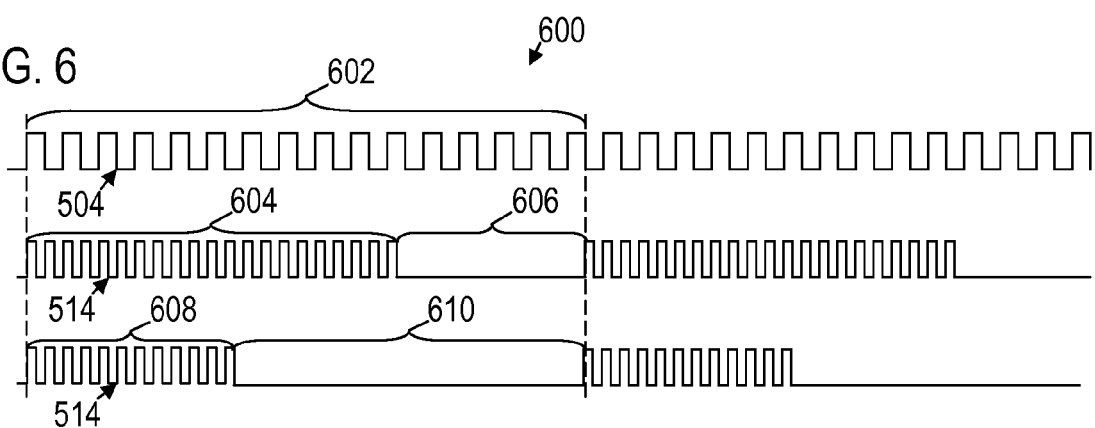

CIRCUIT AGING SENSOR

CROSS-REFERENCE TO RELATED APPLICATION

The present application claims priority to U.S. Provisional Patent Application No. 61/710,435, filed on Oct. 5, 2012; which is hereby incorporated herein by reference in its entirety.

BACKGROUND

As an integrated circuit ages, the operational characteristics of the circuit slowly change, which in turn affects the signals generated or manipulated by the circuit. For example, the duty cycle of a clock signal at a particular frequency may change due to circuit aging effects, or the timing relationship between two or more signals may change due to circuit aging. The aging characteristics of an integrated circuit are dependent on a variety of factors. These factors include device fabrication attributes, environmental conditions, and operating parameters. Device fabrication attributes include aspects of the integrated circuit fabrication process that influence aging. Environmental conditions include the ambient temperature at which the integrated circuit is operated, which in turn may determine the circuit temperature. Functional parameters include, for example, the voltage at which the circuit is operated.

SUMMARY

A sensor for monitoring aging related change in circuit performance is disclosed herein. Embodiments of the sensor may create and characterize dynamic aging stress and/or provide monitoring of aging degradation of a circuit under dynamic voltage scaling and/or dynamic frequency scaling. In one embodiment, an integrated circuit includes a circuit aging sensor configured to provide information that is indicative of operational degradation of the integrated circuit due to aging. The circuit aging sensor includes a ring oscillator. The ring oscillator includes a plurality of inverting drivers and a plurality of tuning circuits. The inverting drivers are sequentially coupled to form a ring. An output of each of the inverting drivers is coupled to an input of one of the tuning circuits, and an input of each of the drivers is coupled to an output of one of the tuning circuits. Each of the tuning circuits includes a first signal path and a second signal path. The first signal path, when selected, applies a tuning delay to an input signal received from one of the inverting drivers for provision to an input of a successive one of the inverting drivers. The second signal path, when selected, routes the signal received around the tuning delay to the input of the successive one of the inverting drivers.

In another embodiment, an integrated circuit includes a circuit aging sensor configured to provide information that is indicative of operational degradation of the integrated circuit due to aging. The circuit aging sensor includes a first ring oscillator and a second ring oscillator. The first ring oscillator includes a plurality of inverting drivers that are sequentially coupled to form a ring. The second ring oscillator also includes a plurality of inverting drivers that are sequentially coupled to form a ring. The first ring oscillator is powered by a first power supply voltage. The second ring oscillator is powered by a second power supply voltage that is higher than the first power supply voltage, and that causes the second ring oscillator to oscillate at a higher frequency than the first ring oscillator. The second ring oscillator is configured to oscillate for a predetermined number of cycles after the second oscillator is enabled and thereafter to halt oscillation until the first ring oscillator has oscillated for at least the predetermined number of cycles after the second oscillator is enabled.

In a further embodiment, a circuit aging sensor includes a first ring oscillator, a second ring oscillator, and a power supply multiplexer. The first ring oscillator includes a plurality of inverting drivers that are sequentially coupled to form a ring. The second ring oscillator includes a plurality of inverting drivers that are sequentially coupled to form a ring. The power supply multiplexer is coupled to the second ring oscillator, and is configured to selectably route one of a plurality of different power supply voltages to the second ring oscillator. The first ring oscillator is powered by a first power supply voltage, and is configured to oscillate continuously. The second ring oscillator is powered by a second power supply voltage selectably provided from the power supply multiplexer. The second power supply voltage is higher than the first power supply voltage, and causes the second ring oscillator to oscillate at a higher frequency than the first ring oscillator. The second ring oscillator is configured to oscillate for a predetermined number of cycles after the second oscillator is enabled and thereafter to halt oscillation until the first ring oscillator has oscillated for at least the predetermined number of cycles after the second oscillator is enabled.

BRIEF DESCRIPTION OF THE DRAWINGS

For a detailed description of exemplary embodiments of the invention, reference will now be made to the accompanying drawings in which:

FIG. 6 shows a timing diagram that illustrates operation of an aging sensor that measures aging with dynamic voltage scaling in accordance with various embodiments.

NOTATION AND NOMENCLATURE

Figure 1:
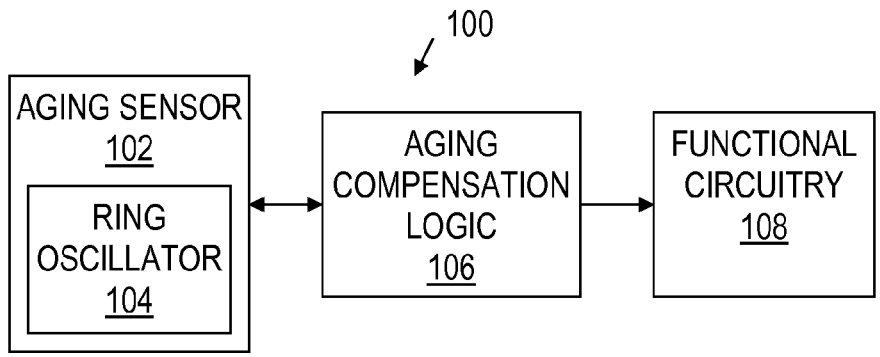
FIG. 1 shows a block diagram of an integrated circuit that includes a circuit aging sensor in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The recitation "based on" is intended to mean "based at least in part on." Therefore, if X is based on Y, X may be based on Y and any number of additional factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

In an integrated circuit, age related signal and clock edge degradation may be a function of circuit activity (i.e., workload), and in low-power circuits such degradation may be strongly affected by bias temperature instability (BTI) (e.g., negative BTI (NBTI) or positive BTI (PBTI). BTI induced by circuit inactivity (holding the circuit in a static state in which DC voltage is applied to transistor inputs) can cause an increase in circuit delay affecting one edge of a signal propagated by the circuit, thereby changing the duty cycle of the signal and affecting circuit timing related to the edge. To minimize energy consumption, circuitry often enters an inactive state (e.g., clocking is disabled) that tends to asymmetrically age the circuit components. Conventional age sensors fail to adequately account for such BTI induced asymmetric aging, and as a result compensation for asymmetric aging is lacking in conventional integrated circuits, which can result in undesirable failure of the circuit.

Embodiments of the aging sensors disclosed herein include circuitry that allows for measurement of asymmetric aging due to BTI. Aging compensation logic that applies the circuit aging sensors of the present disclosure can determine the effects of asymmetric aging on the integrated circuit and adjust circuit parameters (e.g., power supply voltage) to ensure adequate operational timing margins, thereby preventing untimely failure of the circuit.

The aging sensors disclosed herein also allow for measurement of circuit aging in the presence of varying workload and dynamic voltage scaling (DVS). Using DVS, the power supply voltage of a circuit is adjusted as needed to provide circuit performance suitable for a given task. Because transistor aging is dependent on the applied voltage and duration of activity, aging should be assessed over a variety of workload/voltage combinations to determine what parameters may provide adequate performance while minimizing aging effects. The aging sensors of the present disclosure provide aging measurements for a wide variety of workloads at a plurality of operational voltages, allowing aging compensation logic to select workload/power supply voltage combinations that provide adequate performance while minimizing the effects of aging.

FIG. 1 shows a block diagram of an integrated circuit 100. The integrated circuit 100 includes a circuit aging sensor 102, aging compensation logic 106, and functional circuitry 108. The functional circuitry 108 includes circuitry that provides the functionality of the integrated circuit 100. For example, if the integrated circuit 100 is a microcontroller, then the functional circuitry 108 may include a microcontroller core, memory (static random access memory, dynamic random access memory, FLASH memory, etc.), clock generation, microcontroller peripherals, power control circuitry, etc.

Some operational parameters of the functional circuitry 108 may be controlled by the aging compensation logic 106. The aging compensation logic 106 monitors aging information provided by the aging sensor 102, and determines, based on the aging information, whether a parameter of the functional circuitry 108 should be adjusted to compensate for age induced degradation in performance of the functional circuitry 108. For example, if the aging compensation logic 106 determines, based on aging information provided by the aging sensor 102, that timing performance of the functional circuitry 108, or a portion thereof, is becoming unreliable at a current voltage and/or frequency, then the aging compensation logic 106 may change a parameter of the functional circuitry (e.g., increase the voltage powering the functional circuitry 108 and/or adjust signal frequency or timing) to improve timing performance.

The aging sensor 102 provides aging information to the aging compensation logic 106. The aging information is indicative of performance degradation in the functional circuitry 108 with age. The aging sensor 102 includes a ring oscillator 104. Some embodiments of the aging sensor 102 may include a plurality of ring oscillators 104. Degradation in the performance of the ring oscillator 104 with age is indicative of degradation in the performance of the functional circuitry 108 with age.

In digital circuits, such as complementary metal oxide semiconductor (CMOS) circuits, BTI aging is dependent on the state in which a transistor is held. For example, PMOS transistors are subject to NBTI aging when held in an active state, and NMOS transistors are subject to PBTI aging when held in an active state. Accordingly, in CMOS logic, a PMOS transistor with a logic "0" at its gate terminal is subject to NBTI aging that affects the performance of the transistor.

In a series of complementary transistor pairs (e.g., CMOS inverters) connected as a ring oscillator, when the transistors are statically stressed by holding the oscillator in a disabled state, the PMOS transistor of every other complementary pair is subject to NBTI aging. Thus, the PMOS transistors of the ring oscillator are asymmetrically aged.

Figure 2:
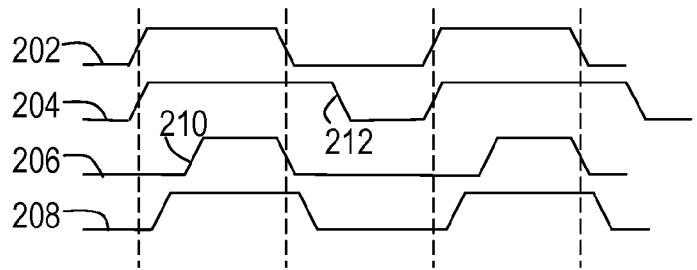
FIG. 2 shows waveforms that illustrate the effects of asymmetric aging in accordance with various embodiments.

FIG. 2 shows waveforms that illustrate the effects of asymmetric aging in a reference circuit with respect to a 50% duty cycle input signal. Waveform 202 illustrates a 50% duty cycle signal at the output of the reference circuit, where the reference circuit exhibits no degradation due to aging. Waveform 208 is an example of a 50% duty cycle signal at the reference circuit output, where the transistors of the reference circuit have been dynamically stressed by maintaining propagation of the oscillating signal through the reference circuit. The signal 208 maintains a 50% duty cycle, and is somewhat delayed, with respect to the signal 202, due to aging in the reference circuit.

Waveform 204 illustrates signal output where the reference circuit is subject to asymmetric aging caused by holding the input to the circuit in a first state (e.g., a logic "0") prior to reception of the 50% duty cycle input signal. The duty cycle of the waveform 204 is substantially distorted with respect to the input signal by delay of the falling edge 212. Similarly, waveform 206 illustrates signal output where the reference circuit is subject to asymmetric aging caused by holding the input to the circuit in a second state (e.g., a logic "1") prior to reception of the 50% duty cycle input signal. The duty cycle of the waveform 204 is substantially distorted with respect to the input signal by delay of the rising edge 210.

As shown in FIG. 2, the change in edge timing caused by asymmetric aging is substantially greater than that exhibited by the output 208 of the dynamically stressed circuit. Accordingly, use of a dynamically stressed ring oscillator in an aging sensor fails to account for the effects of asymmetric aging. Further, disabling a conventional ring oscillator statically stresses only every other inverter and also fails to adequately represent the change in timing exhibited in clock or datapath circuitry due to asymmetric aging.

Figure 3:
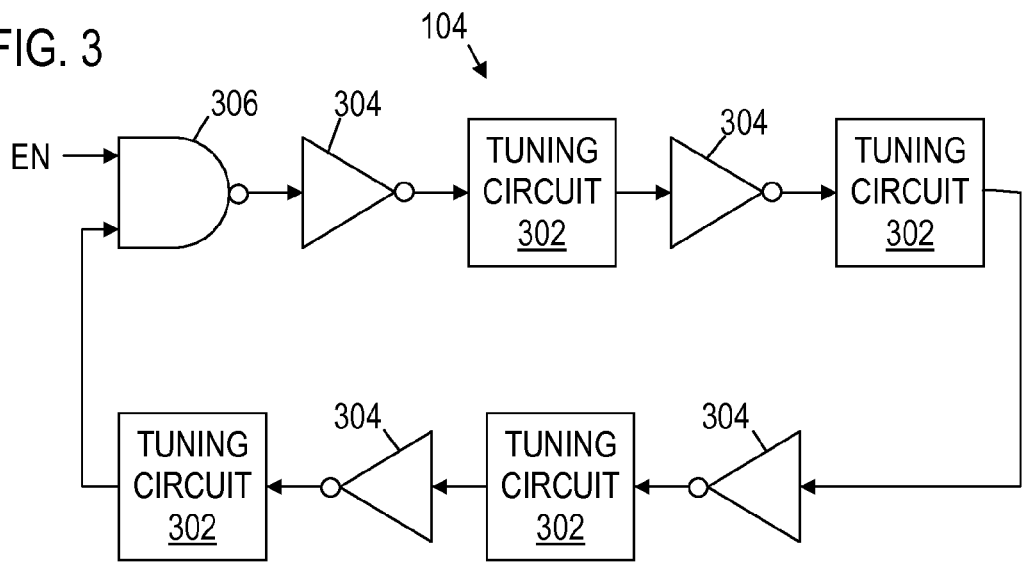
FIG. 3 show a schematic diagram of a ring oscillator suitable for inclusion in an aging sensor in accordance with various embodiments.

FIG. 3 show a schematic diagram of the ring oscillator 104, which provides effective measurement of the effects asymmetric aging. The ring oscillator 104 includes a plurality of inverting drivers 304, a plurality of tuning circuits 302, and an enable/disable control gate 306. The inverting drivers 304 are illustrated as inverters as a matter of convenience, but in practice may be any inverting device. For example, the inverting driver may a NOR gate, a NAND gate, or any other device that provides an inverted output with respect device input.

The control gate 306 enables and/or disables oscillation in the ring oscillator 104 based on the state of the input signal EN. The control gate 306 is illustrated as being a NAND gate, but in practice may be any inverting device capable of enabling and/or disabling the ring oscillator responsive to the control signal EN. The ring oscillator 104 is subject in asymmetric aging when the input signal EN disables oscillation.

The tuning circuit 302 allows the duty cycle of the signal generated by the ring oscillator 104 to be controlled over a wide range, and allows all of the inverting drivers 304 to be statically stressed when the ring oscillator 104 is disabled. An instance of the tuning circuit 302 is coupled to the output of each inverting driver 304, and the output of each tuning circuit 302 is coupled to an input of a successive device, which may be either an inverting driver 304 or the control gate 306.

Figure 4:
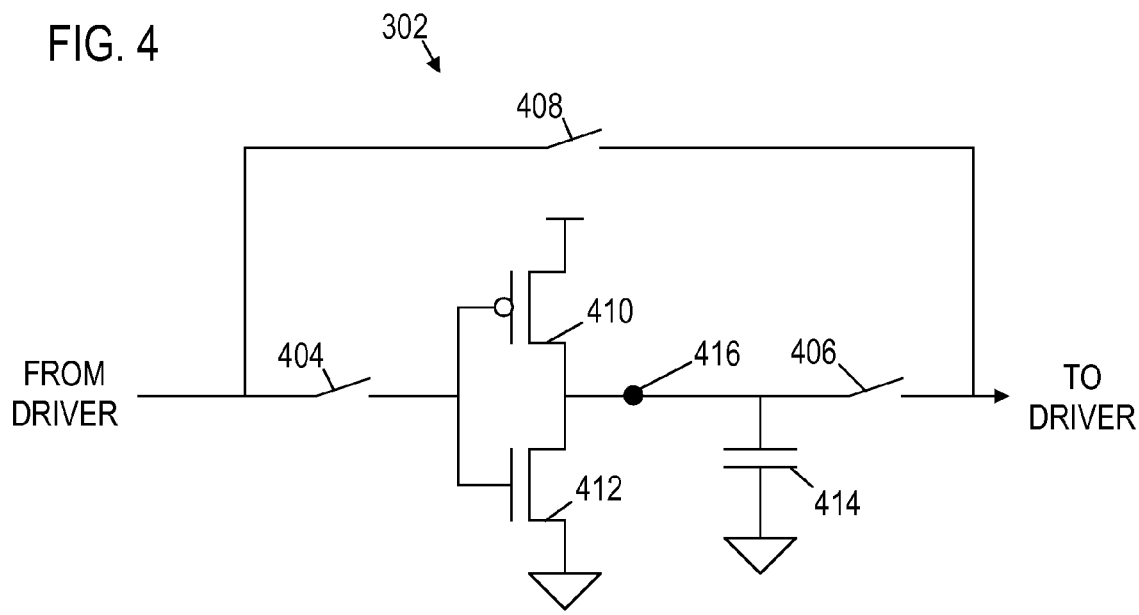
FIG. 4 shows a schematic diagram of a tuning circuit included in a ring oscillator suitable for use in an aging sensor in accordance with various embodiments.

FIG. 4 shows a schematic diagram of the tuning circuit 302 in accordance with various embodiments. The tuning circuit 302 includes switches 404, 406, and 408, capacitor 414, PMOS transistor 410, and NMOS transistor 412. The switches 404-408 are arranged to provide two different paths for signal flow through the tuning circuit 302. The first path is a stress path that is enabled when stressing the device coupled to the output of the tuning circuit 302. The stress path is enabled by opening switch 408 and closing switches 404 and 406, thereby inserting transistors 410, 412 and capacitor 414 into the signal path. The second path is a measurement path that is enabled when measuring the effects of aging on the ring oscillator 104. The measurement path bypasses the transistors 410, 412 and capacitor 414, and is enabled by closing switch 408 and opening switches 404 and 406. The switches 404-408 may include analog-friendly transistors or other signal switching technologies.

The transistors 410 and 412 are connected to form an inverter. Consequently, the signal driven onto the output terminal 416 by the transistors 410, 412 is inverted with respect to the signal flowing through the input switch 404, and the signal provided to the inverting driver 304 coupled to the output of the tuning circuit is inverted with respect to the signal provided by the inverting driver 304 coupled to the input of the tuning circuit 302. The inversion provided by the stress path allows the tuning circuit 302 to statically stress all of the inverting drivers 304 when the ring oscillator 104 is disabled, rather statically stressing only alternate inverters as is typical in a conventional ring oscillator. By statically stressing all of the inverting drivers 304, the ring oscillator 104 provides a more accurate representation of the effects of asymmetric aging on the transistors of the functional circuitry 108, and allows the aging compensation logic to better compensate for the effects of asymmetric aging, thereby avoiding correctable timing failures in the integrated circuit 100.

In some embodiments of the tuning circuit 304, the transistors 410, 412 may be replaced by more complex inverting circuitry, e.g., NOR gate circuitry, NAND gate circuitry, or other suitable inverting components.

The transistors 410, 412 and the capacitor 414 also operate to allow adjustment of the duty cycle of the oscillating signal in the stress path. The value of the capacitance 414 and the drive strength of the transistors 410, 412 may selected to produce a desired duty cycle in the stress path. Thus, the tuning circuit 302 allows the inverting drivers 304 to be stressed using selected duty cycles, which may produce different aging of the inverting drivers 304.

The tuning circuit 302 may allow the duty cycle of the ring oscillator 104 to be varied during operation of the integrated circuit 100 by manipulating the capacitor 414 and/or the transistors 410, 412. In some embodiments of the tuning circuit 302, the capacitor 414 may be a capacitor bank that includes a plurality of capacitors, and a switch associated with each of the capacitors. The switch allows each capacitor of the capacitor bank to be selectably connected to the output terminal 416. The aging sensor 102, the age compensation logic 106, or other control circuitry of the integrated circuit 100 may control which of the capacitors of the capacitor bank is connected to the output terminal 416, thereby controlling the capacitance at the output terminal 416 to adjust the delay provided by the tuning circuit 302 and the duty cycle of the ring oscillator 104.

In some embodiments of the tuning circuit 302, each of the transistors 410, 412 may include a plurality of transistors. A switch may be associated with each transistor to allow the transistors to be selectably connected to the output terminal 416. The aging sensor 102, the age compensation logic 106, or other control circuitry of the integrated circuit 100 may control which of the transistors is connected to the output terminal 416, thereby controlling the drive current at the output terminal 416 to adjust the delay provided by the tuning circuit 302 and the duty cycle of the ring oscillator 104.

Embodiments of the ring oscillator 104 may vary the duty cycle of oscillation over a range of at least 10% duty cycle to 90% duty cycle by selectably varying the capacitance and/or drive strength provided at the output terminal 416. Some embodiments of the ring oscillator 104 may vary the duty cycle of oscillation over a range of at least 1% duty cycle to 99% duty cycle (0.001% to 99.999% in some embodiments) by selectably varying the capacitance and/or drive strength provided at the output terminal 416. Embodiments of the ring oscillator 104 in whole, e.g., via application of controls such as EN in addition to the tuning circuit 302, may selectably vary the duty cycle of oscillation over a range of 0% to 100%.

Figure 5:
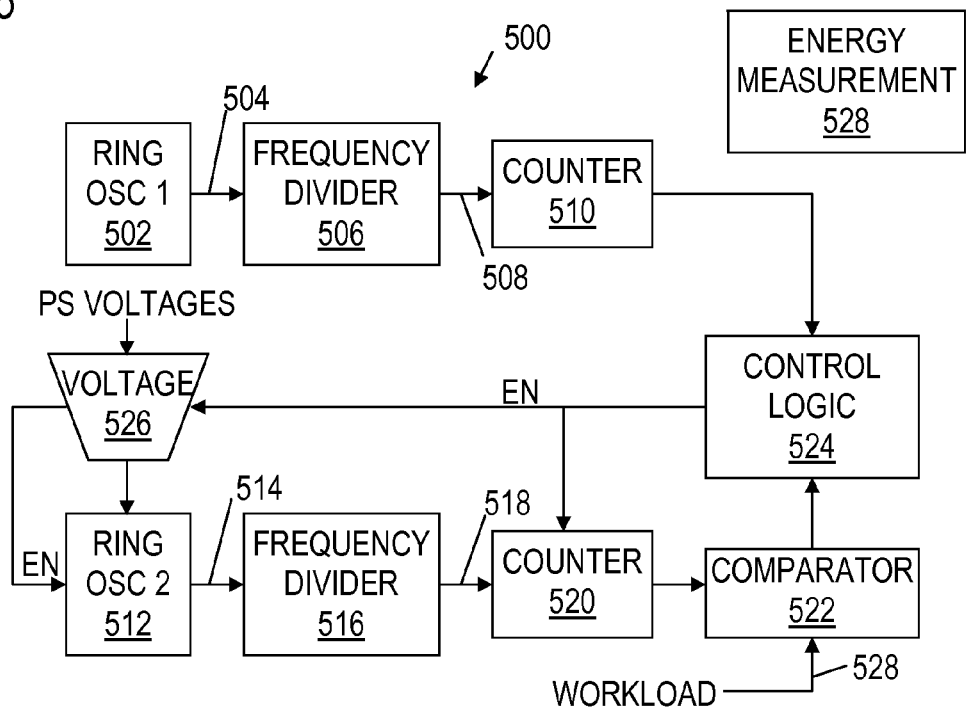
FIG. 5 shows a block diagram for a circuit aging sensor that measures aging with dynamic voltage scaling in accordance with various embodiments.

FIG. 5 shows a block diagram for a circuit aging sensor 500 that measures aging with dynamic voltage scaling (DVS) in accordance with various embodiments. Some embodiments measure aging with dynamic voltage scaling and dynamic frequency scaling (DVFS). The aging sensor 500 may be applied as, or as a component of, the aging sensor 102. DVS is applied in the integrated circuit 100, by increasing a voltage powering a circuit when more performance is required, and reducing the voltage to reduce energy consumption when less performance is required. Transistor aging is dependent on circuit voltage and operating time. Consequently, DVS can result in different circuit aging rates. The aging sensor 500 can measure aging when DVS applied.

The aging sensor 500 includes a first ring oscillator 502, a first frequency divider 506, and a first counter 510. The first ring oscillator 502 clocks the frequency divider 506, via oscillating signal 504, and the first counter 510 is incremented by the output 508 of the frequency divider 506. The first ring oscillator 502 is powered by a first voltage. The aging sensor also includes a second ring oscillator 512, a second frequency divider 516, and a second counter 520. The second ring oscillator 512 clocks the second frequency divider 516, via oscillating signal 514, and the second counter 520 is incremented by the output 518 of the frequency divider 516. In some embodiments of the aging sensor 500, the ring oscillators 502, 512 may be embodiments of the ring oscillator 104.

The aging sensor 500 also includes a voltage multiplexer 526 that selectably routes a power supply voltage to the second ring oscillator 512. The voltage provided to the second ring oscillator 512 via the multiplexer 512 is higher than the voltage powering the first ring oscillator 502. Accordingly, the second ring oscillator 512 oscillates at a higher frequency than the first ring oscillator 502. The multiplexer 526 may route any of a plurality of different power supply voltages to the second ring oscillator 512. Each of the voltages may be higher than the voltage powering the first ring oscillator 502. The oscillation rate of the second ring oscillator 512 may be different for each different power supply voltage provided by the multiplexer 526. The multiplexer 526 may also route to the second ring oscillator 512 a voltage lower than the voltage applied during oscillation.

The aging sensor 500 further includes a comparator 522 and control logic 524. The comparator 522 is coupled to the second counter 520, and compares the count value output by the counter 520 to a workload value 528. The workload value may be stored in a register coupled to the comparator 522. The workload value 528 identifies a count value that corresponds to a predetermined number of cycles of oscillation of the ring oscillator 512.

The control logic 524 is coupled to the comparator 522 and to the first counter 510. The control logic 524 can disable the second ring oscillator 512 when the comparator 522 indicates that second ring oscillator 512 has operated for a duration (i.e., produced clock cycles) sufficient to satisfy the workload 526. The control logic 524 can enable the second ring oscillator 512 when the first ring oscillator 502 has operated for a duration (i.e., produced clock cycles) sufficient to satisfy a predetermined workload. The predetermined workload satisfied by the first ring oscillator 502 is defined as a 100% workload. The workload value 526 assigned to the second ring oscillator 512 may be equal to or less than the 100% workload applied to the first ring oscillator 502. For example, a 100% workload, a 50% workload (i.e., half the number of cycles of the 100% workload), etc. may be applied to the second ring oscillator 512. In some embodiments, the workload applied to the second ring oscillator 512 may vary from at least 1% to 100%. Because the second ring oscillator 512 oscillates a higher frequency than the first ring oscillator, the workload assigned to the second ring oscillator 512 is always completed prior to the 100% workload assigned to the first ring oscillator 502.

FIG. 6 shows a timing diagram 600 that illustrates operation of the aging sensor 500 in accordance with various embodiments. The signal 504 is the clock output of the first ring oscillator 502. The interval 602 represents the duration required to generate sufficient clocks 504 to satisfy the predetermined 100% workload. The clock 514 has a higher frequency than the clock 504. Accordingly, in the duration 604, the clock 514 satisfies the 100% workload and the control logic 524 disables the second ring oscillator 512 for duration 606 until the first ring oscillator 502 satisfies the 100% workload.

In the interval 608, the second ring oscillator 512 satisfies a workload value 528 set to less than 100% (e.g., 50%), and the control logic 524 disables the second ring oscillator 514 for duration 610 until the first ring oscillator 502 satisfies the predetermined 100% workload.

The aging sensor 500 may also include energy measurement circuitry 528 to measure the energy consumed by each of the ring oscillators 502, 512 over the predetermined 100% workload. The aging compensation logic 106 can evaluate and compare the effects of aging of the second ring oscillator 512 at different power supply voltages and workloads, and in conjunction with measured energy consumption, can adjust parameters of the functional circuitry 106 to cause the functional circuitry 106 to operate at a voltage and workload sufficient to satisfy operational performance requirements while minimizing the effects of circuit aging and energy consumption.

The above discussion is meant to be illustrative of the principles and various embodiments of the present invention. Numerous variations and modifications will become apparent to those skilled in the art once the above disclosure is fully appreciated. For example, while the aging sensors disclosed herein have been described in the context of an operating integrated circuit, those skilled in the art will understand that the disclosed aging sensors can be applied in other integrated circuit contexts to measure circuit aging. It is intended that the following claims be interpreted to embrace all such variations and modifications.

What is claimed is:

1. An integrated circuit, comprising:
   a circuit aging sensor configured to provide information that is indicative of operational degradation of the integrated circuit due to aging, the circuit aging sensor comprising:
   a first ring oscillator, comprising:
      a plurality of inverting drivers that are sequentially coupled to form a ring; and
      a plurality of tuning circuits;
      wherein an output of each of the inverting drivers is coupled to an input of one of the tuning circuits, and an input of each of the drivers is coupled to an output of one of the tuning circuits;
      wherein each of the tuning circuits comprises:
         a first signal path that when selected applies a tuning delay to an input signal received from one of the inverting drivers for provision to an input of a successive one of the inverting drivers; and
         a second signal path that when selected routes the signal received around the tuning delay to the input of the successive one of the inverting drivers.

2. The integrated circuit of claim 1, wherein each of the tuning circuits comprises, in the first signal path:

a tuning circuit driver configured to provide an inverted version of the input signal at an output terminal of the tuning circuit driver;

a tuning capacitor coupled to the output terminal of the tuning circuit driver;

an input switch configured to selectably propagate the input signal to the tuning circuit driver; and an output switch configured to selectably couple the output terminal to the successive inverting driver.

3. The integrated circuit of claim 2, wherein the tuning capacitor comprises a plurality of capacitors each coupled to the output terminal via an associated switch; wherein the tuning delay is variable by selectably connecting the capacitors to the output terminal via the associated switches.

4. The integrated circuit of claim 2, wherein the tuning circuit driver comprises a plurality of positive metal oxide semiconductor (PMOS) transistors complementarily coupled to a plurality of negative metal oxide semiconductor (NMOS) transistors; wherein the tuning delay is variable by selectably connecting the transistors to drive the output terminal via switches associated with each of the transistors.

5. The integrated circuit of 1, wherein the tuning delay is variable, and variation of the tuning delay provides selectability in duty cycle of the first ring oscillator in a range of at least 10% to 90%.

6. The integrated circuit of claim 1, wherein the first ring oscillator is configured to selectably provide a duty cycle of oscillation variable over a range of 0% to 100%.

7. The integrated circuit of claim 1, wherein the tuning circuits are configured to stress all of the inverting drivers equally while the first ring oscillator is disabled.

8. The integrated circuit of claim 1, wherein the integrated circuit is configured to:
select the first signal path while stressing the inverting drivers; and
select the second signal path while measuring aging of the inverting drivers.

9. The integrated circuit of claim 1, wherein the circuit aging sensor further comprises:
a second ring oscillator, comprising a plurality of inverting drivers that are sequentially coupled to form a ring;
wherein:
the first ring oscillator is powered via a first power supply voltage, and is configured to oscillate continuously;
the second ring oscillator is powered by a second power supply voltage that is higher than the first power supply voltage, and causes the second ring oscillator to oscillate at a higher frequency than the first ring oscillator; and
the second ring oscillator is configured to oscillate for a predetermined number of cycles after the second ring oscillator is enabled and thereafter to halt oscillation until the first ring oscillator has oscillated for at least the predetermined number of cycles after the second ring oscillator is enabled.

10. An integrated circuit, comprising:
a circuit aging sensor configured to provide information that is indicative of operational degradation of the integrated circuit due to aging, the circuit aging sensor comprising:
a first ring oscillator comprising a plurality of inverting drivers that are sequentially coupled to form a ring;
a second ring oscillator comprising a plurality of inverting drivers that are sequentially coupled to form a ring;
wherein:

the first ring oscillator is powered by a first power supply voltage;

the second ring oscillator is powered by a second power supply voltage that is higher than the first power supply voltage, and causes the second ring oscillator to oscillate at a higher frequency than the first ring oscillator; and the second ring oscillator is configured to oscillate for a predetermined number of cycles after the second oscillator is enabled and thereafter to halt oscillation until the first ring oscillator has oscillated for at least the predetermined number of cycles after the second oscillator is enabled.

11. The integrated circuit of claim 10, further comprising a power supply multiplexer coupled to the second ring oscillator, the power supply multiplexer configured to selectably route one of a plurality of different power supply voltages to the second ring oscillator as the second power supply voltage; wherein each of the plurality of different power supply voltages is higher than the first power supply voltage.

12. The integrated circuit of claim 10, wherein the integrated circuit is configured to:
vary the second power supply voltage; and
determine, based on an output of the first ring oscillator and an output of the second ring oscillator, a measure of operational degradation due to circuit aging at each value of the varying second power supply voltage.

13. The integrated circuit of claim 10, further comprising:
a first counter coupled to an output of the first ring oscillator;
a second counter coupled to an output of the second ring oscillator;
a comparator coupled to the second counter, the comparator configured to determine whether the second ring oscillator has oscillated for the predetermined number of cycles; and
control logic coupled to the first counter and the comparator, and configured to:
disable the second ring oscillator based on the comparator indicating that the second ring oscillator has oscillated for the predetermined number of cycles;
determine, based on output of the first counter, whether the first ring oscillator has oscillated for a predefined number of cycles that is at least as great as the predetermined number of cycles; and
enable the second ring oscillator based on a determination that the first ring oscillator has oscillated for the predefined number of cycles.

14. The integrated circuit of claim 12, wherein the integrated circuit is configured to vary the predetermined number of cycles in a range of at least 1% to 100% of the predefined number of cycles.

15. The integrated circuit of claim 10, further comprising a power measurement circuit coupled to the first ring oscillator and the second ring oscillator, and configured to measure energy consumed by each ring oscillator.

16. The integrated circuit of claim 10, wherein at least one of the first ring oscillator and the second ring oscillator comprises a plurality of tuning circuits; wherein an output of each of the inverting drivers is coupled to an input of one of the tuning circuits, and an input of each of the drivers is coupled to an output of one of the tuning circuits; wherein each of the tuning circuits comprises:
a duty cycle adjustment circuit, comprising:

a tuning circuit driver configured to provide an inverted signal at an output terminal of the tuning circuit driver;

a tuning capacitor coupled to the output terminal of the tuning circuit driver;

an input switch configured to selectably propagate a signal received from a preceding inverting driver to the tuning circuit driver; and an output switch configured to selectably couple the output terminal to the a successive inverting driver; and a bypass switch configured to selectably route the signal received from the preceding inverting driver around the duty cycle adjustment circuit.

17. A circuit aging sensor, comprising:

a first ring oscillator comprising a plurality of inverting drivers that are sequentially coupled to form a ring;

a second ring oscillator comprising a plurality of inverting drivers that are sequentially coupled to form a ring; and a power supply multiplexer coupled to the second ring oscillator, the power supply multiplexer configured to selectably route one of a plurality of different power supply voltages to the second ring oscillator;

wherein:
the first ring oscillator is powered by a first power supply voltage, and is configured to oscillate continuously;

the second ring oscillator is powered by a second power supply voltage selectably provided from the power supply multiplexer; wherein the second power supply voltage is higher than the first power supply voltage, and causes the second ring oscillator to oscillate at a higher frequency than the first ring oscillator; and the second ring oscillator is configured to oscillate for a predetermined number of cycles after the second oscillator is enabled and thereafter to halt oscillation until the first ring oscillator has oscillated for at least the predetermined number of cycles after the second oscillator is enabled.

18. The circuit aging sensor of claim 17, further comprising:

a first counter coupled to an output of the first ring oscillator;

a second counter coupled to an output of the second ring oscillator;

a comparator coupled to the second counter, the comparator configured to determine, based on an output of the second counter, whether the second ring oscillator has oscillated for the predetermined number of cycles; and control logic coupled to the first counter and the comparator, and configured to:

disable the second ring oscillator based on the comparator indicating that the second ring oscillator has oscillated for the predetermined number of cycles;

determine, based on output of the first counter, whether the first ring oscillator has oscillated for a predefined number of cycles that is at least as great as the predetermined number of cycles; and enable the second ring oscillator based on a determination that the first ring oscillator has oscillated for the predefined number of cycles.

19. The circuit aging sensor of claim 18, wherein at least a selected one of the first ring oscillator and the second ring oscillator comprises a plurality of tuning circuits; wherein, for the selected one, an output of each of the inverting drivers is coupled to an input of one of the tuning circuits, and an input of each of the drivers is coupled to an output of one of the tuning circuits; wherein each of the tuning circuits comprises:

a duty cycle adjustment circuit, comprising:

a tuning circuit driver configured to provide an inverted signal at an output terminal of the tuning circuit driver;

a tuning capacitor coupled to the output terminal of the tuning circuit driver;

an input switch configured to selectably propagate a signal received from a preceding inverting driver to the tuning circuit driver; and an output switch configured to selectably couple the output terminal to a successive inverting driver; and a bypass switch configured to selectably route the signal received from a preceding inverting driver around the duty cycle adjustment circuit.

20. The circuit aging sensor of claim 19, wherein the tuning capacitor comprises a plurality of capacitors each coupled to the output terminal via an associated switch; wherein the circuit aging sensor is configured to vary duty cycle of oscillation by selectably connecting the capacitors to the output terminal via the associated switches; and wherein the duty cycle tuning circuit is configured to selectably provide a duty cycle of oscillation in a range of at least 1% to 99%.

* * * * *